United States Patent [19]

Klein

[11] Patent Number: 5,008,649

[45] Date of Patent: Apr. 16, 1991

[54] MAGNETIC SECURITY SYSTEM AGAINST THEFT AND BURGLARY AND METALLIC SENSOR ELEMENT SUITABLE THEREFOR

[75] Inventor: Erhard Klein, Butjadingen, Fed. Rep. of Germany

[73] Assignee: Karl Harms Handels-GmbH & Co. KG, Jever, Fed. Rep. of Germany

[21] Appl. No.: 308,227

[22] Filed: Feb. 9, 1989

Related U.S. Application Data

[63] Continuation of Ser. No. 229,951, Aug. 9, 1988, abandoned, which is a continuation-in-part of Ser. No. 172,888, Mar. 25, 1988, abandoned.

[30] Foreign Application Priority Data

Dec. 10, 1987 [DE] Fed. Rep. of Germany ....... 3741780

[51] Int. Cl.[5] ....................... G08B 13/14; G01R 33/00

[52] U.S. Cl. ................................... 340/572; 324/260; 340/551

[58] Field of Search ................... 340/572, 551, 825.72, 340/825.57, 825.59, 825.62, 825.69; 324/260, 244, 234; 73/862.36; 365/133

[56] References Cited

U.S. PATENT DOCUMENTS

| | | | |
|---|---|---|---|
| 3,820,090 | 6/1974 | Wiegand | 365/133 |
| 4,326,124 | 4/1982 | Faude | 235/382 |
| 4,523,482 | 6/1985 | Barkhoudarian | 73/862.36 |
| 4,591,788 | 5/1986 | Mohri et al. | 324/260 |
| 4,622,542 | 11/1986 | Weaver | 340/572 |
| 4,635,227 | 1/1987 | Normann | 365/133 |
| 4,639,670 | 1/1987 | Normann | 324/260 |
| 4,792,018 | 12/1988 | Humble et al. | 340/572 X |

*Primary Examiner*—Glen R. Swann, III
*Assistant Examiner*—Thomas J. Mullen, Jr.
*Attorney, Agent, or Firm*—Wegner, Cantor, Mueller & Player

[57] ABSTRACT

An apparatus for securing objects located in a room, in particular a (self-service) place of sale such as a supermarket, against theft. The objects to be secured are each equipped with at least one magnetically activatable sensor metal element. A first apparatus to be arranged at each room outlet generates a magnetic field, in the area of which field, the sensor metal element generates a signal when a field strength limit value is exceeded. A second apparatus associated with the first apparatus detects the signal and conducts it to an alarm apparatus, so as to trigger an alarm. The sensor metal elements are in each case configured so that in the active state they generate, in a region of the magnetic field in which the field strength is greater than a lower limit value, an atypical signal which is not generated by other metallic objects under magnetic excitation, but rather is only generated by a magnetizable object which has been purposefully subjected to a special treatment. The first apparatus consists of at least one field coil which surrounds the room outlet in an annular form, and whose height and breadth are so configured that a person can pass through it. The sensor metal element is preferably a Wiegand wire.

43 Claims, 2 Drawing Sheets

Z
7.3
8
Y
8
8
7.1
7.2
2.1
X
II
III
21
15
1
6
4
2.2
7
10
5
2.1
7
14
12
13
16
12'
19
18

2.1
7
2.3
2.2
4
6
3
7
5
15
1
20
16
21
12
I
11
15

Fig.3
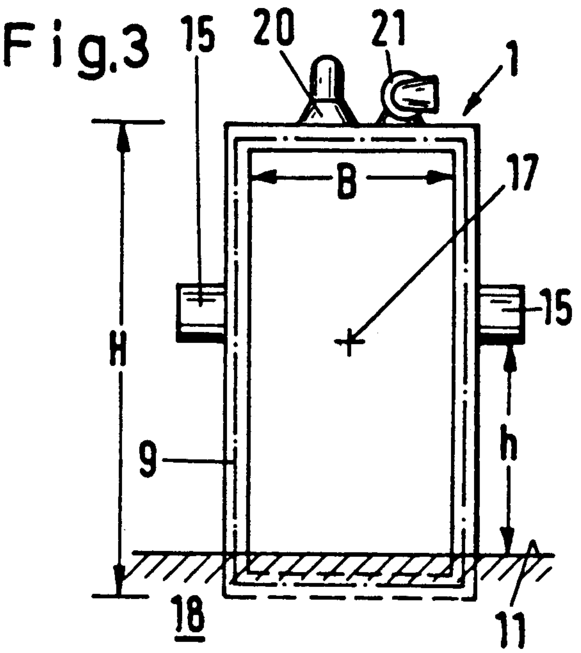
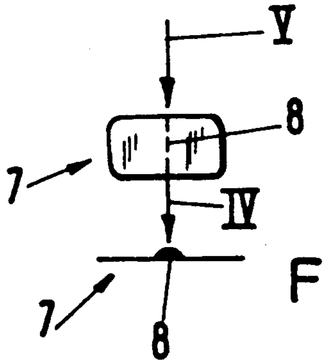
Fig.4
Fig.5

MAGNETIC SECURITY SYSTEM AGAINST THEFT AND BURGLARY AND METALLIC SENSOR ELEMENT SUITABLE THEREFOR

This application is a continuation of U.S. application Ser. No. 229,951, filed Aug. 9, 1988, abandoned, which is a continuation-in-part of U.S. application Ser. No. 172,888, filed Mar. 25, 1988, now abandoned.

BACKGROUND OF THE INVENTION

The invention concerns a system for the securing of objects located in a room presenting at least one room outlet, in particular a (self-service) place of sale (such as for example a supermarket), against theft and burglary. The objects to be secured are each equipped with at least one magnetically activatable sensor metal element. A first apparatus is arranged at each room outlet to generate a magnetic field, in the area of which field the magnetically activated sensor metal element, arranged on an object to be secured, generates a detectable signal when a field strength limit value is exceeded. A second apparatus associated with the first apparatus detects the generated signal, which in the event of its occurrence is conducted to an alarm apparatus, so as to trigger an alarm.

The invention furthermore concerns a sensor metal element suitable for this purpose, as well as the use of a section of a Wiegand wire as a sensor metal element for a magnetic security system of the kind under discussion here.

When reference is made above or below to a "room outlet," this does not necessarily need—particularly in the case of the use of a system according to the present invention as a merchandise theft security system in a place of sale or exhibition—to involve an exit from the room in question, which leads either outdoors or into another room and accordingly is let into a bordering wall of the room in question. Instead, it may also involve a passage or the like arranged within the room in question (for example, at a cash register), bounded in a suitable manner, as is referred to in general in the pertinent technical field generally as a control gate, i.e., a passage through which persons must pass in order to leave the room, particularly a delimited part of the room, if they want to leave the part of the room in question. On the other hand, in the case of the use of the system under the invention as a burglary security system, as a general rule a conventional entrance/exit will be involved, as additionally will be windows, floor or cellar hatches, and the like, i.e., room outlets that are present in a wall, the ceiling or the floor of the room to be secured. Security against theft of merchandise kept ready for sale in places of sale is called for not only for relatively high-value merchandise, but also for lower-value objects, since regrettably such crimes against property are not limited to higher-value goods. Rather, on the basis of corresponding investigations, one proceeds on the assumption that for example in so-called supermarkets or similar places of sale, in which the merchandise kept in stock is picked up in each case by customers as needed (generally in a shopping basket or cart) and is then paid for at a cash register, the loss of merchandise resulting from theft refers practically to all offered merchandise, and amounts in sum to more than 1% of the total turnover. This value is consequently extremely high, particularly in view of the relatively low profit margins of such places of sale, and requires corresponding countermeasures.

In addition to various other attempts to effectively secure merchandise against theft, various magnetic systems are known. These systems are still unsatisfactory, both in the technical regard (including their effectiveness) and in the economic regard. Such known magnetic theft security systems are frequently suitable from the outset for only a limited use, if only because of the investments to be performed with respect to the necessary apparatus, on the one hand, and the sensor elements to be used, on the other hand. For if, for example, the average profit margin of a supermarket is 1% of the merchandise value and the value of a given item of merchandise amounts to 5.00 DM, then it is obviously not economically sound to secure such an object with a (non-reusable) sensor metal element that costs 6 pfennigs, thus eliminating the profit to be earned. Moreover, the above example is by no means unrealistic; it is actually a conservative estimate of the cost of such sensor elements. Other sensor metal elements for use with magnetic theft security systems cost even more (for example approx. 0.25 DM), and accordingly, if only for economic reasons, can at best be used for very high-value merchandise with a corresponding merchandise value.

The known theft security systems on a magnetic basis, however, furthermore also present considerable technical defects, as will be explained in detail further below. A particularly grave defect, among others, is that false alarms occur relatively frequently. False alarms not only delay the planned brisk execution of sales (and in this way lead to a corresponding annoyance of customers), but also very frequently have the effect of annoying customers who on the basis of a false alarm have been exposed as a presumed thief and who must undergo a corresponding investigative procedure. Many such customers in the future avoid a place of sale equipped with such a theft security system, because the risk of a false alarm is too great for them and the circumstances associated with an—albeit unfounded—suspicion are unpleasant, so that in this way over the course of time a place of sale loses a not inconsiderable turnover.

In known theft security systems of the class under discussion here, the sensor metal elements to be fastened in each case to an object to be secured consist in each case of a metal strip, which consists of a highly permeable metal, preferably a corresponding metal alloy with a markedly rectangular hysteresis loop. In addition, the metal strips forming the sensor elements must be fastened with a separate security label to an object to be secured, because the price tags commonly used for labeling are too small to be able to be equipped with such a metal strip. A length of, for example, 7 cm is necessary for the sensor metal elements of current systems, in order to be able to generate the desired signals. In this connection, it should be noted that because of the necessary size of the sensor, which thereby necessitates separate labeling, security costs in the case of such a system are still further increased due to the additional work step required to equip an object with such a sensor element.

A further drawback of such or similarly configured sensor elements is that because of their size they are relatively readily recognizable by potential thieves, and accordingly can be easily discovered and if applicable rendered ineffectual by tearing off or the like. In the case of certain sensor elements for known electromagnetic theft security systems, in which the sensor elements are configured in the form of a printed circuit that is applied on a corresponding security label, not even a removal of the sensor element is needed in order to render this element ineffectual. Rather, for this purpose it is sufficient merely if individual conductor segments are cut by means of a sharp object, for which purpose for example even a fingernail may suffice.

In a typical theft security system, if an object equipped with a magnetically activated sensor metal element is brought to a room outlet in a supermarket or the like, i.e., for example to a control gate set up adjacent to a cash register, at which gate an (alternating) magnetic field is generated by means of a corresponding apparatus, then harmonics are induced because of the non-linear hysteresis loop of the material of the sensor metal element in a corresponding apparatus, which essentially consists of an induction coil. These harmonics may be evaluated by means of a suitable electronic filter apparatus, so that when corresponding harmonics occur an acoustic and/or optical alarm is triggered (if applicable, the room outlet may be closed), thus indicating that a correspondingly secured object is being unauthorizedly removed from the room in question.

If, on the other hand, a correspondingly secured object is properly paid for and only afterward taken through a correspondingly equipped room outlet, its magnetization is deactivated after payment in such a way that during passage through the room outlet no harmonics occur that supply a signal for an unauthorized removal of a secured object.

Concretely, the apparatus of a known theft security system of such a type consequently consists, in addition to the already repeatedly mentioned strip-like sensor metal elements, the induction coil forming the pickup coil and the filter electronics, of an exciter coil, which generates the alternating electromagnetic field. This field drives the security strip, consisting of a low-retentivity metal, into saturation and then generates magnetic reversal processes in it because of the alternating field, which processes are detected with the induction coil. Then by means of the filter electronics the fundamental frequency is expediently suppressed and only the harmonics (generally lying between the second and twentieth harmonics, frequently reaching up into the 100-kHz range) are evaluated. Thus, it is important that these harmonics should be excited even at relatively low exciting field strengths, with which the previously known systems operate, but that nevertheless these harmonics to be generated and evaluated should differ as much as possible from signals generated by other objects besides sensor metal elements, such as by objects which a customer may be carrying with him or else has properly declared and paid for as merchandise for purchase. To achieve in the essentials these requirements, which in any case are not one hundred percent satisfiable, the magnet material of such a security strip serving as a sensor metal element must be both extremely highly permeable and also markedly rectangular with regard to its hysteresis loop. These requirements are satisfied well by certain high-Co, low-retentivity, amorphous alloys, which are nearly magnetostriction-free. In this connection a combination of a magnetically active strip with a magnetically half-hard material makes it possible to put out of operation the security function of a sensor metal element in the event of the authorized removal of a correspondingly secured article. For this purpose, for example, the half-hard part of the metal loop is magnetically reversed in a purposeful manner by an external field, and in this way linearizes the characteristic of the magnetically active strip part, by which means the harmonics supplying the signal that is desired in the event of an unauthorized removal are reduced so severely in amplitude that they are no longer detected as harmonics by the filter electronics and no longer trigger any alarm signal. Unfortunately in this regard also, matters do not remain as correspondingly wished, and despite a corresponding magnetic reversal, through misinterpretation of the signal, a false alarm occurs.

SUMMARY OF THE INVENTION

The present invention is based on the task of creating a security system of the class described at the start, while avoiding the aforementioned drawbacks and others, which system satisfies the requirements to be posed, in both the technical and the economic regard. In this connection, in the technical regard, consequently on the one hand it should of course be ensured that removal of an illegitimately removed object is indeed actually detected (at least with a sufficiently great statistical probability), while the triggering of a false alarm is avoided with a probability bordering on certainty. In the economic regard, with the security system of the present invention, the necessary investments with regard to the necessary apparatus, and particularly also the necessary sensor metal elements, should be considerably reduced, through correspondingly low procurement costs and through a considerable reduction in application costs (for example, in that a sensor metal element can be applied with a price tag to an object to be secured). Furthermore, the sensor metal element for the security system of the present invention (because of a smallest possible size) are fairly unrecognizable, thus preventing discovery and inactivation by potential thieves. Finally, the security system of the present invention can advantageously also be used as a burglary security system. A further part of the set task forming the basis for the present invention lies in a new use of a Wiegand wire described in detail further below.

The present invention accomplishes the above objects by using sensor metal elements configured so that in the active state they generate, in a region of the magnetic field in which the field strength is greater than a lower limit value (i.e., tripping field strength), an unambiguous signal that is not generated by other magnetic objects in a magnetic exciting field. Instead, this signal is only generated by a magnetizable object when the latter has been subjected to a special treatment. The first apparatus arranged at each room outlet consists of at least one (first) field coil with a horizontal center axis, which surrounds the room outlet in question in an annular form, and whose height and breadth are so configured that a person can pass through it in the direction of its center axis.

To simplify the evaluation of the signal to be generated, a second apparatus generally consisting of a filter electronics unit or the like, in a manner known in itself, is provided. In this way, the alternating magnetic field generated bY the first apparatus is converted into a quasi-stationary signal, which can be considerably better evaluated than a singular signal.

Under a most highly preferred design of the present invention, the system is so configured that the signal to be detected by the second apparatus—preferably by at least one induction coil of the second apparatus—is a pulse that for reasons presented in detail further below is preferably asymmetric.

A most highly preferred configuration of a sensor metal element under the invention lies in its design as a Wiegand wire with a length (only) preferably approx. 5 to 20 mm. The sensor of this preferred embodiment may be used in connection with conventional price tags, with a length approx. 1 cm. The diameter may amount to approx. 0.15 to 0.4 mm and is approx. 0.25 mm in a most highly preferred design of the present invention.

The so-called Wiegand wire is a magnetic wire storage element that makes use of the Wiegand effect known from the literature, which effect consists in that a wire made up of a certain ferromagnetic material that has undergone a certain treatment spontaneously alters its direction of magnetization when subjected to a magnetic field whose field strength exceeds a certain limit value (i.e. tripping field strength). A Wiegand wire consists in principle of two sections with different magnetic properties, where the coercive force of the one section is significantly above the coercive force of the other section, although across its cross section the wire presents an essentially uniform chemical composition. One possible method for producing a Wiegand wire consists of subjecting a ferromagnetic material having a fine grain structure to a longitudinal stress, which stress suffices to conduct it permanently, subjecting the material to a cyclic torsional strain, and removing the longitudinal stress on the wire. The resulting Wiegand wire has a jacket section and a core section, each of which have different cohesive forces, as is for example described in German Patent 21 43 326.

The spontaneous change in the direction of magnetization of a Wiegand wire when the tripping field strength is exceeded, as already mentioned above, is also referred to in the literature as a Large Barkhausen Discontinuity or Large Barkhausen Jump. This spontaneous change can induce in an induction coil arranged sufficiently nearby a voltage pulse that presents approximately the shape of a Gaussian bell curve, and may have a half-amplitude duration of, for example, approximately 20 $\mu$sec.

In the case when a Wiegand wire is brought into a DC magnetic field whose field strength exceeds the tripping field strength, a singular dynamic signal is generated. However, for turning on and evaluation it is desirable to generate not simply a singular dynamic signal, so a periodic alternating magnetic field is preferably generated using the first apparatus to generate the magnetic field in a known manner, so that the Wiegand wire generates quasi-stationary signals. This alternating field is preferably generated with a frequency generator whose frequency lies in the range from 400 to 800 Hz. The frequency generator need not be constantly in operation, but rather preferably is switched on automatically only when a person approaches it, and accordingly is also preferably switched back off automatically when the person moves away from it. This can be accomplished by the simplest switching equipment measures (for example via a light barrier).

As may already have been expressed with sufficient clarity for the cognizant expert from the above remarks, the so-called Wiegand wire is a sensor metal element which is particularly suitable in the context of the present invention, both in the technical regard and from economic viewpoints. However, this should not imply that there are not other possible designs for sensor metal elements suitable for the invention, which in the technical and/or economic aspects offer at least approximately the same advantages.

For example, the so-called pulse wire ("Impulsdraht"), produced and marketed by the company Vakuumschmelze GmbH Hanau-Berlin, is an element which can be used advantageously in the context of the present invention. This so-called pulse wire involves a composite wire in which an internal switch core is held under tensile stress by a jacket material. Parallel to the composite wire, a permanent-magnet wire, preferably of the same length and approximately the same diameter, is arranged. Pulse wires having a diameter of ca. 0.1 to 0.2 mm, and a length of ca. 10 to 20 mm is generally sufficient for use as a magnetic sensor. Such pulse wires (without power supply) emit as a magnetic switching element voltage pulses of up to 2 V, so that a magnetism-reversing field of only ca. 20 A/cm is needed in order to trigger a pulse, and the pulse half-amplitude duration lies in the area of ca. 12 $\mu$sec. Such pulse wires are currently used for the detection of magnetic fields as well as for storage of information.

As has already been explained above, the apparatus arranged at each room outlet consists at least of one field coil, which in addition to other features is dimensioned so that its height is approximately 2 m (for example 2.2 m) and its breadth is approximately 1 m (for example 0.8 m), so that a person can walk through the field coil without effort. The coil surrounds the room outlet more or less in an annular form, and in connection with a theft security system, the lower leg of the field coil is expediently sunk into the floor of the room, so that the person will not trip over the lower leg. When used in connection with a burglary security system, the other legs of the field coil may also be set into a wall or the ceiling of the room in question.

A field coil of approximately 5 to 15 $cm^2$ in cross-section, having a winding number of approximately 100 to 200 windings of copper wire, is sufficient to achieve the sought effect, moreover with electrical values of a manageable size and above all with a Wiegand wire of sufficiently small dimensions.

In this connection, in the case of an arrangement of only one field coil at a room outlet, an object taken illegitimately, and thus having a non-deactivated Wiegand wire, can be detected when the longitudinal axis of the Wiegand wire essentially coincides with the vector of the exciting alternating magnetic field generated by the field coil. Therefore, since in the case of such an arrangement, already more than a third of all random room positions of a sensor metal element configures as a Wiegand wire are detected and reported with certainty, a thief, who by experience regularly strikes a given place of sale more than once, statistically is caught one out of every two or three thefts.

To increase, namely to double, the reporting certainty, the first apparatus located at each room outlet may include a second field coil, whose center axis runs at an angle to the center axis of the first field coil. If in this connection the center axes of the first and second field coils run perpendicularly to one another, another third of all conceivable random positions of the sensor metal element configured as a Wiegand wire can be detected. One-hundred-percent detection certainty can be achieved if an additional third field coil is provided whose magnetic vector runs perpendicularly to the magnetic vector of the first and second field coils. Unfortunately, arranging a third field coil may produce certain difficulties in maintaining a passable room outlet. However, the same detection certainty can also be achieved by equipping the object to be secured with several sensor metal elements, whose longitudinal axes stand at right angles to one another. To be sure, this requires a greater expense, which however may in some cases be entirely worthwhile, in particular in the case of high-value goods. It is also economically justifiable if one realizes that a sensor metal element configured according to the present invention requires a cost expenditure of only about 0.5 pfennigs, which is some 2 to 3 orders of magnitude less than the sensor metal elements of comparable systems.

If a sensor metal element configured as a Wiegand wire is pre-magnetized and if the tripping field strength does not exceed an upper limit value (for example, does not exceed the value 25 A/cm in the case of an established trigger field strength of 16 A/cm), then the pulse image generated in the second apparatus by an active sensor metal element when subjected to the alternating magnetic field is asymmetric; the positive pulse is significantly higher than the negative pulse, Or vice versa. By contrast, the positive and negative pulses of an element in the demagnetized state are of comparable magnitude. This effect is utilized by the present invention by deactivating the sensor metal elements configured as Wiegand wires when a correspondingly secured object is legitimately carried through a room outlet after being paid for.

As pointed out above, the second apparatus of the security system of the present invention consists essentially of at least one induction coil with a filter apparatus, preferably arranged following it. In this connection it has proved particularly useful if on two parallel legs of each field coil in each case an induction coil is arranged, the induction coils in addition being sensibly arranged so that they convert changes in the magnetic field, the vector of such changes running parallel to the center axis of the field coil and to its magnetic vector.

The induction coils are preferably configured with low self-capacitance without a metal core.

The filter apparatus arranged following the coils filters the signal generated by a sensor metal element so that the signals leading to a triggering of an alarm are allowed to pass, while other signals are filtered out. A computer may be associated with the filter apparatus, which determines the processing sequence. Arrangement may also be made so that the computer is first activated (for example by means of a light barrier) when a person approaches a room outlet, and the computer then turns on the frequency generator. Preferably, the computer, upon receiving signals, does not arrange in every case for the triggering of an alarm when a pulse signal of any nature whatever is reported to it (as may quite well be the case in a design of the present invention), but rather it first checks the probability that these signals are in fact signals generated by a sensor metal element. This may be done, in particular in the case of the use of a Wiegand wire as the sensor metal elements, by checking the amplitude ratio of the positive and negative pulses that are generated, due to the alternating magnetic field generated by the field coil(s), in the induction coil/induction coil(s) during the respective magnetic reversal. False alarms are further reduced by triggering the alarm only when the ratio of positive and negative amplitude (or vice versa) exceeds a predetermined value. If one wants to rule out false alarms practically completely, one can so program the computer that an alarm is only triggered when this amplitude ratio is for example 2:1 or even 3:1.

The full investment expense for a security system according to the present invention is low compared with comparable known systems. This is achieved, among other means, through the fact that it is necessary to use only a single computer and only one frequency generator for all room outlets of a room that is to be secured. For generally, for example in a supermarket, not all customers who are at a cash register, and thus are located in front of a room outlet (control gate), enter the room outlet simultaneously, and it is still more improbable that several thieves will pass through a room outlet exactly at the same point in time. Accordingly it is sufficient if the computer, which may be a single-board computer, supplies the field coil(s) with power from a central frequency generator when a customer approaches the room outlet in question, especially since obviously several room outlets can be turned on virtually simultaneously, and since a measurement procedure in each case lasts only a fraction of a second. Accordingly, for each room outlet that is to be secured, only at least one field coil as well as at least one induction coil is necessary, although so be expedient if each room outlet to be secured is assigned a separate filter electronics unit.

Preferred designs of the present invention are described in the subclaims.

BRIEF DESCRIPTION OF THE DRAWINGS

The invention will be further explained below in connection with the preferred embodiment, which is described with reference to the drawings, in which:

FIG. 3 shows a section through the representation of FIG. 1, looking in the direction of the section line III--III, i.e., a lateral top view of the control gate forming a room outlet, looking in the exiting direction;

FIG. 4 a top view of a price tag (in approximately original size) for the merchandise, where the price tag simultaneously forms the security label and contains a sensor metal element configured as a Wiegand wire, looking in the direction of the arrow IV in FIG. 5; and FIG. 5 shows a lateral view of the price/security label of FIG. 4, looking in the direction of the arrow V in FIG. 4.

DESCRIPTION OF THE PREFERRED EMBODIMENT

Figure 1:
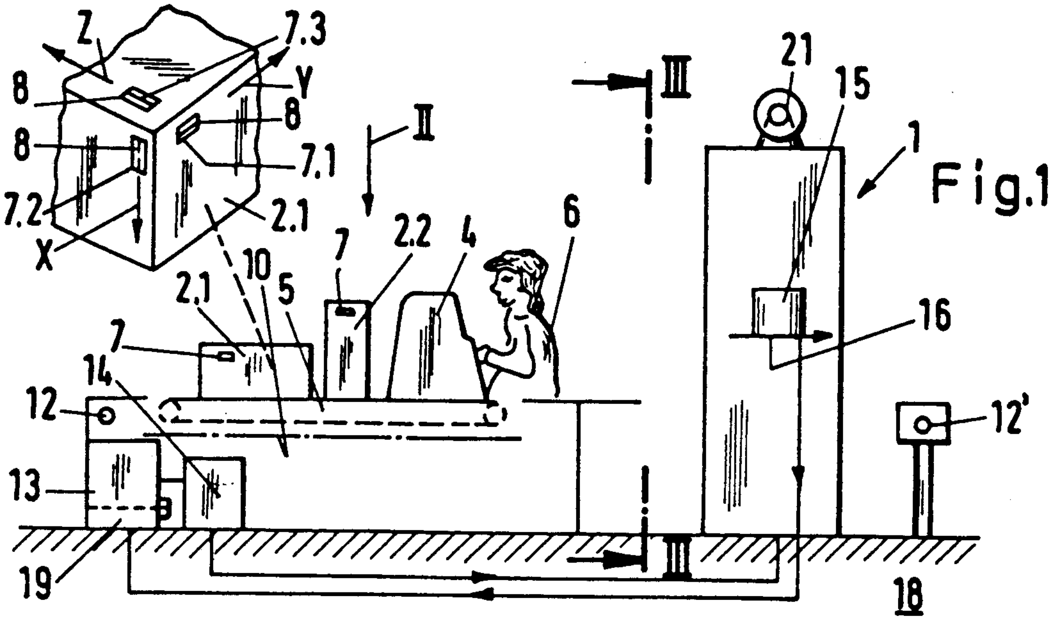
FIG. 1 shows a schematic representation of a control gate arranged at a cash register of a supermarket, where in the upper left part of FIG. 1 a secured object is drawn separately enlarged, partially in perspective, looking in the direction of the arrow I in FIG. 2.
Figure 2:
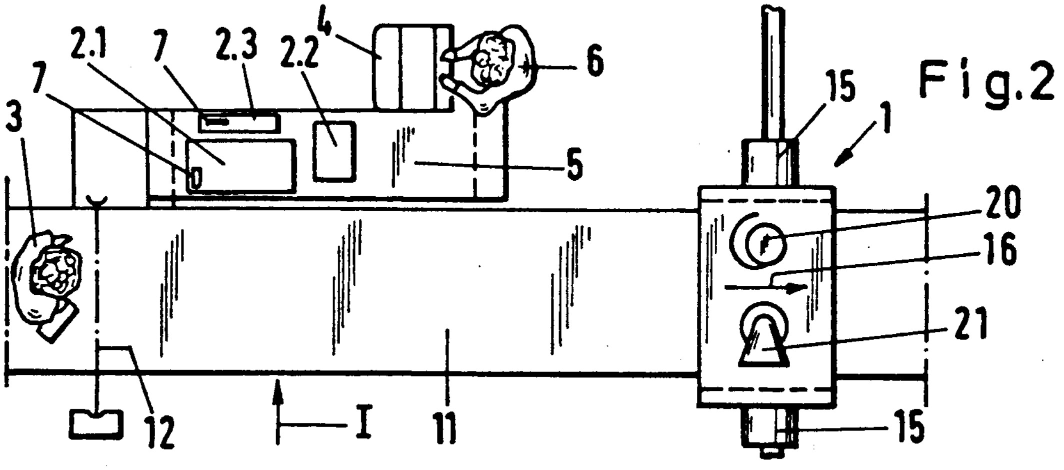
FIG. 2 shows a top view of the representation of FIG. 1, looking in the direction of the arrow II in FIG. 1.

FIGS. 1 to 3 show the application of the present invention as a theft security system in a supermarket, from which only one room outlet configured as a control gate 1 is shown as an example.

The objects to be secured, which consequently in the present embodiment involve merchandise 2 which has been taken away from corresponding merchandise stocks (for example, shelves) by a customer 3 wishing to buy the merchandise, are laid down by the customer 3 onto a conveyor belt 5 and carried toward a cash register 4, which is arranged ahead of the control gate 1. A cashier 6 types the corresponding prices, which in each case can be determined from a price tag 7, into the cash register 4, and settles the amount of purchase with the customer 3.

The price tags 7 are shown in approximately original size in FIGS. 4 and 5. They consist in each case of a paper label, permanently gluable to the merchandise in question 2, on the underside of which a section of a Wiegand wire, which serves as a sensor metal element 8, is permanently arranged. Please note that the sensor metal elements 8 might if applicable also be arranged inside the merchandise 2 or its packaging, so that they cannot be recognized by customers 3.

In the area of the control gate 1, which forms a room outlet, a field coil 9 is arranged, which is indicated in FIG. 1 by a dashed line. As can be seen in particular from FIG. 3, the field coil 9 surrounds the control gate 1 in an annular form. Its height H amounts to 2.2 m and its breadth B amounts to 0.8 m, so that a customer 3 can pass effortlessly through the control gate 1 after the settlement process.

The merchandise 2 kept in stock and offered for sale in the supermarket is equipped in each case with at least one security label, which simultaneously forms the price tag 7. Only one security label is shown for the merchandise 2.2 and 2.3 (see FIGS. 1 and 2), while the merchandise 2.1 is equipped with three security labels 7 (per FIGS. 4 and 5). Each sensor metal element 8 is composed of a Wiegand wire running in the longitudinal direction, with the labels being arranged so that the three Wiegand wires extend in different directions along the arrows x, y and z, as seen at the top left in FIG. 1 (there the merchandise 2.1 is drawn separately in an enlarged representation, partially in perspective). The directions x, y and z each stand perpendicular to one another.

The Wiegand wires serving as sensor metal elements 8 are initially magnetized in their active state. When the merchandise is sold, this activation state is converted into a deactivated state (since the theft security system of course should not trigger an alarm in the case of a proper purchase), by demagnetizing the Wiegand wires in the area of the cash register 4. For this purpose, in the area of the conveyor belt 5 an initially relatively strong alternating magnetic field is generated by means of a field coil 10 indicated with a dashed line in FIG. 1. The magnetic field of the field coil decreases in strength in the direction toward the control gate 1, so that the deactivation of the sensor metal elements 8 takes place automatically in the case of a proper purchase. To prevent, for example, the sensor elements of merchandise 2 also carried along by a customer 3 from being deactivated at the same time, the field coil 10 is shielded in the direction of the passage 11 running parallel to the cash register 4.

The entire security apparatus is preferably only switched on when a customer 3 approaches the area of the cash register 4. For this purpose, a light barrier 12 (see FIG. 2) is provided. The light barrier 12, when the customer passes through, causes a single board computer 13 to be switched on. The computer 13 works for several (if applicable, all) control gates of the supermarket in question, and first of all causes a frequency generator 14, which likewise works for several (if applicable, all) control gates 1 of the supermarket, to be set in operation. The frequency generator 14 draws its power supply from the three-phase supply network and generates a sine-shaped voltage, which amounts to a maximum of 67 V in the illustrated exemplary embodiment. In this case it supplies a peak current of 15 A. The alternating frequency generated by the frequency generator 14 is approximately 600 Hz. The frequency adjusts the system automatically to the resonance frequency of the field coil 9.

The inductive resistance of the field coil 9 is compensated by a correspondingly dimensioned capacitor, in which connection a value of 600 Hz corresponding to the frequency generator 14 is selected as the resonance frequency. Since the capacitor is composed of discrete components, which are not only subject to a certain tolerance but also to a certain aging, the resonance frequency cannot always be set precisely. As already indicated, in order to nevertheless achieve a minimum resistance and generate a maximum magnetic field, the frequency generator 14 automatically hunts out the actual precise resonance frequency of the field coil.

Induction coils 15, 15 are arranged at a height h of 0.9 m on the two vertical legs of the field coil 9 and are oriented so that they convert magnetic field changes whose vector points in the direction of passage of the arrow 16. The induction coils 15, 15 are designed so that they present the lowest possible self capacitance and contain no metal core.

The cross-sectional area of each leg of field coil 9 is preferably about 8 $cm^2$, and is made up of 150 copper windings, which can readily handle a peak current of 15 A, with an internal resistance of about 4 ohms. The magnetic field with this arrangement is weakest at center 17 (see FIG. 3), which is located about 1.1 m above the floor and 0.4 m away from the side edges. The Wiegand wire of the sensor element 8 preferably requires a tripping field strength of about 17 A/cm.

The security system preferably operates as follows. When the customer 3 crosses the light barrier 12, the computer 13 is activated so as to operate the frequency generator. If an object 2 equipped with an active sensor metal element 8 is not deactivated in the area of the cash register 4 (i.e., by means of the alternating magnetic field generated by the field coil 10 in the area of the conveyor belt 5), because the customer is attempting to take the object without paying for t, then when this customer 3 passes through the control gate 1 and reaches an area in which the alternating magnetic field generated by the field coil 9 exceeds the specified tripping field strength, the Wiegand wire (sensor metal element) 8, which is in the magnetic, active state, is turned on with an alternating field of 600 Hz. Thus, the Wiegand wire delivers 600 positive and negative pulses per second due to its magnetic reversal which is performed constantly at a corresponding frequency. The induction coils 15, 15 sense these pulses, and conduct them to a filter electronics unit 19 so that the signal applied to the induction coils 15, 15 is amplified and filtered out in such a way that at the output from the filter electronics unit 19 a signal appears that is conveyed to the computer 13.

The computer 13 first of all checks the probability whether this signal involves Wiegand pulses that have been generated by a Wiegand wire serving as a sensor metal element 8. For this purpose, the computer 13 calculates the amplitude ratio of the amplitude of a positive pulse and of a subsequent negative pulse, which, as long as the field strength does not exceed an upper limit value (which in the illustrated exemplary embodiment lies at approximately 25 A/cm), are extremely different from each other. If the amplitude ratio in the exemplary embodiment presented here is at least 3:1, then the computer 13 is programmed to assume that the pulses it has discerned originate from an active, non-deactivated Wiegand wire, and so triggers a blinking light 20 as an optical alarm, as well as a signal horn 21 as an acoustic alarm. If desirable, the computer can also simultaneously lock the entrance and exit doors of the supermarket. The customer is question can consequently then be subjected to a corresponding check.

If on the other hand the computer 13 does detect Wiegand pulses, but determines that their amplitude ratio is below the amplitude limit ratio of 3:1 established for triggering an alarm, then the computer assumes that a deactivated label is involved, and consequently does not trigger an alarm. This is particularly the case when a Wiegand wire serving as a sensor metal element 8 has been deactivated in the area of the conveyor belt 5 by an alternating magnetic field that is at first strong and then continuously decreases. In this demagnetized state, the amplitudes of the positive and negative pulse are of equal magnitude.

It is readily recognizable that with the security system of the present invention, false alarms are practically non-existent. For on the one hand, such Wiegand pulses are only generated by Wiegand wires which, with a probability bordering on certainty, are not generally carried by customers. Even if, contrary to expectations, this should be the case, the corresponding Wiegand wire would in addition have to still be in an activated state, and the ratio of its positive and negative pulses (or vice versa) would have to exceed the limit value of 3:1. All this is as good as ruled out, so that an alarm in fact can only be triggered when a customer is actually illegitimately carrying a secured item of merchandise 2 past the cash register 4, in order to steal the item.

As has already been explained above, the Wiegand wires may readily be glued along with a conventional price tag 7 onto the merchandise 2 to be secured. In this case, a Wiegand wire approximately 1 cm long is entirely sufficient and need have only a diameter of around 0.25 mm. Despite these small dimensions, however, the sensor metal element 8 configured in this manner cannot be rendered ineffectual by, for example, scratching with a fingernail or the like.

As has also been discussed above, such a Wiegand wire 8 generates a relatively strong, readily evaluatable pulse if its longitudinal axis does not deviate too greatly from the magnetic vector (see arrow 16) of the magnetic field generated by the field coil 9. If a thief is carrying along a correspondingly secured item of merchandise 2, whose sensor metal element 8 is, for example, oriented in the vertical direction when passing through the control gate 1, this would not induce a sufficiently strong pulse in the induction coils 15. This may not be a problem, in the case where the merchandise 2 to be secured does not involve very high-value goods, and/or if one assumes that a thief will strike a place of sale more or less regularly, so that then according to statistical principles he will be detected on the average during every second or third theft, and after corresponding punishment, may be placed under an order to stay away from the premises.

If, on the other hand, one wants to further increase security (for example because the merchandise to be secured at least partially involves higher-value goods), then a second field coil 9, and if applicable also even a third field coil 9, might be installed, whose magnetic vector axes run at angles (if applicable at right angles) to one another, in which case the certainty of detecting a theft is correspondingly increased. Another possibility, however, is instead of providing additional expensive equipment, the higher-value goods can be equipped with two or three sensor metal elements 8, whose longitudinal axes in each case run at an angle, preferably at a right angle, to one another. In this way, for example, the object 2.1 indicated in FIGS. 1 and 2 is secured. It is recognizable that the merchandise 2.1 is equipped with three security labels 7, whose sensor metal element 8, configured as a Wiegand wire, extends in each case at right angles to the other two Wiegand wires 8, 8. In the case of such a security measure, a thief has no chance of passing through the field coil 9 without triggering the alarm, since one of the Wiegand wires 8 is always located in a parallel position or quasi-parallel position to the magnetic vector 16 of the field coil 9. Such a securing with several Wiegand wires 8 is readily justifiable in terms of price, since such sensor metal elements 8 cost not 6 to 25 pfennigs, as in the prior state of the art, but rather 0.5 pfennig, so that obviously a material expense of less than half a pfennig is economically tolerable if thereby practically one-hundred-percent theft security can be achieved.

To increase the indication certainty still further, the Wiegand wires serving as sensor metal elements 8 may also be integrated into the packaging of the merchandise 2 so that a potential thief who is familiar with such a security system practically has no possibility of tracing and removing the sensor metal elements.

Despite this unusually high alarm reporting certainty, a false alarm is practically ruled out, since the computer 13 and the filter electronics unit 19 can readily be programmed so that other pulses, which for example originate from atmospheric disturbances or other electromagnetic interference pulses, are recognized and filtered out during filtering. Even if a metallic object is brought into the area of the field coil 9 and emits a magnetically excited pulse, here too there is no possibility of a false alarm since ultimately an alarm is triggered only in the case of an asymmetric amplitude ratio (of a sufficient size), yet the asymmetry of the positive and negative pulses is a peculiarity of the, Wiegand effect, which occurs with no other metallic materials. A false alarm is accordingly only conceivable when a customer is carrying with him an active Wiegand element that is not a sensor metal element 8 of the security system. But since Wiegand wires are used solely in rpm meters and flow meters, and it is not usual to carry such devices with oneself while shopping in a supermarket, visiting an exhibition or the like, a false alarm is consequently practically ruled out.

At the same time, with the security system of the present invention, practically all conceivable merchandise is securable. Only the securing of highly magnetic products (for example magnetic food cans) is problematic, since if applied they may prevent an excitation of the Wiegand wire.

In addition to the exemplary embodiment described above and represented schematically in the attached drawing, which refers to a supermarket, of course all other possible places of sale or exhibition, libraries, etc. may be provided in an advantageous manner with a security system under the invention.

As has been discussed briefly above, the security system of the present invention is also suitable as a burglary security system, for example, in private households. In this connection, the room outlets leading to the outside, such as windows, doors, floors and cellar hatches, etc., are provided in each case with at least one field coil, which is expediently embedded right during construction (if applicable, also afterwards) into the wall surrounding the room outlet in question. If the objects to be secured are each (in the most invisible possible place) equipped with a Wiegand wire (in this case, of course, the use of numerous Wiegand wires is readily supportable in terms of cost), then in an analogous manner an alarm is triggered when an object secured with at least one Wiegand wire is conveyed outward through a room outlet, since when the field coil is activated the object then triggers a Wiegand pulse in at least one induction coil. The pulse, after being recognized, leads to the triggering of an alarm. A burglary security system configured in this manner is still more advantageous compared to known burglary security systems, insofar as it cannot be recognized as such and also practically cannot be switched off by illegitimate burglars, since the frequency generator preferably to be provided can be installed at any concealed point of a house, an apartment or the like in such a way that is practically not discoverable, and since particularly in the case of larger objects, it is practically impossible for burglars to look for Wiegand wires. Even if they look, they furthermore can never be sure whether on a certain object (for example an expensive piece of furniture, a carpet or the like) the have actually discovered all Wiegand wires, assuming they are familiar with the security system of this invention.

I claim:

1. An apparatus for securing an object located in a room having at least one room outlet against theft, comprising:

at least one field coil surrounding each room outlet which generates a magnetic field, each of said at least one field coil having a horizontal axis, and a height and breadth which are suitable for a person to walk through the field coil in the direction of the horizontal axis;

at least one magnetically-activated sensor metal element fixed to the object which, when brought into an active state by a special treatment, generates a first signal when the sensor metal element is brought within a distance of one of said at least one field coil so as to exceed a field strength limit value means for detecting the first signal from the sensor metal element;

an alarm which is triggered when said detecting means detects the first signal; and said first signal being distinguishable by the detecting means from signals generated by other metallic objects when under magnetic excitation.

2. The apparatus as claimed in claim 1, wherein said field coil generates an alternating magnetic field, and said sensor metal element, when in the active state, is excited by said alternating magnetic field to emit a quasi-stationary pulse which is detected by said detecting means.

3. The apparatus as claimed in claim 2, wherein said quasi-stationary pulse is asymmetric.

4. The apparatus as claimed in claim 1, wherein said sensor metal element, when brought into an inactive state, generates a second signal, when the sensor metal element is brought within said distance of one of said at least one field coil so as to exceed the field strength limit value, which is quantitatively or qualitatively different from said first signal.

5. The apparatus as claimed in claim 4, wherein said sensor metal element is a Wiegand wire.

6. The apparatus as claimed in claim 5, wherein the Wiegand wire has a length between 5 and 20 mm.

7. The apparatus as claimed in claim 6, wherein the length of the Wiegand wire is approximately 1 cm.

8. The apparatus as claimed in claim 5, wherein the Wiegand wire has a diameter between 0.15 and 0.4 mm.

9. The apparatus as claimed in claim 8, wherein the diameter of the Wiegand wire is approximately 0.25 mm.

10. The apparatus as claimed in claim 5, comprising two sensor metal elements attached to the object located at an angle with respect to each other.

11. The apparatus as claimed in claim 10, wherein said angle is 90°.

12. The apparatus as claimed in claim 5, comprising three sensor metal elements attached to the object located at an angle to each other.

13. The apparatus as claimed in claim 10, wherein said angle is 90°.

14. The apparatus as claimed in claim 4, wherein said sensor metal element is a pulse wire comprising a composite wire having an inner core which is kept under tensile stress by a jacket material, and a permanent magnetic wire arranged parallel to the composite wire.

15. The apparatus as claimed in claim 4, wherein said detecting means comprises at least one induction coil which detects the signals from said sensor metal element.

16. The apparatus as claimed in claim 15, wherein said detecting means comprises two induction coils mounted on opposing parallel legs of said field coil, said induction coils being oriented so that they convert changes in the magnetic field generated by the field coil, the vector of which runs parallel to the horizontal axis of the field coil.

17. The apparatus as claimed in claim 16, wherein said induction coils are located at a height which is approximately one half of the height of said field coil.

18. The apparatus as claimed in claim 15, wherein said at least one induction coil has low self-capacitance.

19. The apparatus as claimed in claim 15, wherein said at least one induction coil does not have a metal core.

20. The apparatus as claimed in claim 15, wherein said detecting means further comprises an amplifier connected to said induction coil which amplifies the signals from the sensor metal element.

21. The apparatus as claimed in claim 15, wherein said detecting means further comprises a filter connected to said induction coil which selectively filters portions of the signals from the sensor metal element.

22. The apparatus as claimed in claim 21, wherein said room has a plurality of room outlets, one of said at least one field coils is located at each room outlet, and the frequency generator and the computer are connected to all of the field coils.

23. The apparatus as claimed in claim 4, further comprising a deactivation apparatus which generates a magnetic field sufficient to bring said sensor metal element into the inactive state.

24. The apparatus as claimed in claim 23, wherein said deactivation apparatus is arranged along a conveyor belt located by the room outlet, the strength of the magnetic field produced by the deactivation apparatus decreasing along the conveyor belt.

25. The apparatus as claimed in claim 1, wherein the height of said field coil is approximately 2 m and the breadth of said field coil is approximately 1 m.

26. The apparatus as claimed in claim 1, wherein the height of said field coil is approximately 2.2 m and the breadth of said field coil is approximately 0.8 m.

27. The apparatus as claimed in claim 1, wherein said field coil has a leg cross-section which is between 5 and 15 $cm^2$.

28. The apparatus as claimed in claim 27, wherein the leg cross-section of said field coil is approximately 8 $cm^2$.

29. The apparatus as claimed in claim 1, wherein said field coil has between 100 and 200 windings of copper wire.

30. The apparatus as claimed in claim 29, wherein said field coil has approximately 150 windings of copper wire.

31. The apparatus as claimed in claim 1, wherein said field coil has a lower leg which is sunken into the floor of the room.

32. The apparatus as claimed in claim 31, wherein said field coil has side legs and an upper leg which are embedded into a wall of the room.

33. The apparatus as claimed in claim 1, comprising two said field coils, the horizontal axes of said field coils being disposed at angle with respect to each other.

34. The apparatus as claimed in claim 33, wherein said angle is 90°.

35. The apparatus as claimed in claim 1, further comprising a frequency generator for exciting said field coil, said frequency generator generating a frequency between 400 and 800 Hz.

36. The apparatus as claimed in claim 35, wherein said frequency generator generates a frequency of approximately 600 Hz.

37. The apparatus as claimed in claim 35, further comprising means for switching said frequency generator on automatically when a person approaches the field coil.

38. The apparatus as claimed in claim 35, further comprising a capacitative resistor connected to said field coil so that the resonant frequency of the capacitative resistor together with the inductance of the field coil is approximately equal to the exciting frequency of said frequency generator.

39. The apparatus as claimed in claim 38, wherein said capacitative resistor is connected in series with said field coil.

40. The apparatus as claimed in claim 38, wherein said frequency generator automatically adjusts the exciting frequency according to the resonant frequencY of the capacitative resistor together with the inductance of the field coil.

41. An apparatus for securing an object located in a room having at least one room outlet against theft, comprising:

at least one field coil surrounding each room outlet which generates a magnetic field, each of said at least one field coil having a horizontal axis, and a height and breadth which are suitable for a person to walk through the field coil in the direction of the horizontal axis;

a frequency generator for exciting said field coil;

at least one magnetically-activated sensor metal element fixed to the object which, when brought into an active state by a special treatment, generates a first signal when the sensor metal element is brought within a distance of one of said at least one field coil so as to exceed a field strength limit value, and wherein said sensor metal element, when brought into an inactive state, generates a second signal, when the sensor metal element is brought within said distance of one of said at least one field coil so as to exceed the field strength limit value, which is quantitatively or qualitatively different from said first signal;

means for detecting a signal from the sensor metal element, said detecting means comprising at least one induction coil which detects the signal from said sensor metal element, an amplifier connected to said induction coil which amplifies the signal from the sensor metal element, and a computer which receives the signal from said amplifier and determines whether the signal is the first signal generated by the sensor metal element, wherein said first signal is distinguishable from signals generated by other metallic objects when under magnetic excitation;

means for switching said computer on automatically when a person approaches the field coil; and an alarm which is triggered when said detecting means detects the first signal.

42. An apparatus as claimed in claim 41, wherein said computer determines that the signal is the first signal when a ratio of a positive amplitude of the signal to a negative amplitude of the signal, or vice versa, exceeds a predetermined ratio.

43. The apparatus as claimed in claim 42, wherein said predetermined ratio is 3:1.

* * * * *